Aug. 12, 1969 N. H. WILLIAMS 3,461,401

KLYSTRON AMPLIFIER EMPLOYING A LONG LINE FEEDBACK CIRCUIT TO PROVIDE A STABLE HIGH POWER MICROWAVE GENERATOR

Filed Nov. 24, 1967 2 Sheets-Sheet 1

INVENTOR.
NORMAN H. WILLIAMS

BY Robert V. Dilts

ATTORNEY

INVENTOR.
NORMAN H. WILLIAMS
BY
Robert W. Dilts
ATTORNEY

United States Patent Office 3,461,401

Patented Aug. 12, 1969

3,461,401

KLYSTRON AMPLIFIER EMPLOYING A LONG LINE FEEDBACK CIRCUIT TO PROVIDE A STABLE HIGH POWER MICROWAVE GENERATOR

Norman H. Williams, San Francisco, Calif., assignor to Varian Associates, Palo Alto, Calif., a corporation of California Continuation-in-part of application Ser. No. 609,651, Jan. 16, 1967. This application Nov. 24, 1967, Ser. No. 688,942

Int. Cl. H03b 9/04

U.S. Cl. 331—83 23 Claims

ABSTRACT OF THE DISCLOSURE

A stable high power microwave generator is formed by feeding a portion of the output of a klystron amplifier back to its input via a long transmission line having an electrical length equal to or greater than Q wavelengths, where Q is one over the fractional bandwidth between the amplitude response points above which the loop gain is greater than unity. Such a microwave generator is especially suited for use as a source of microwave power for industrial microwave heating or treating applications.

Industrial microwave heating systems are described wherein the feedback is derived from the output of the microwave applicator load such that variable phase shifts produced by the work in the applicator do not stop oscillation of the tube and whereby the power delivered to the work is automatically regulated to a given power level. In addition, a PIN diode electronically-variable attenuator is included in the feedback path of certain microwave applicator systems for automatically regulating the power level of the oscillator or for regulating the reflected power at the output of the tube. In other embodiments, a plurality of microwave applicators are tuned to different frequencies. A ferrite phase shifter is employed in the feedback path of the klystron for tuning the klystron oscillator to the frequency of a selected one of the applicators to shift the power applied to the work in accordance with the shift in oscillator frequency. Ir still another embodiment, plural applicators tuned to different frequencies are employed. The feedback for the klystron is derived from the applicator which is most heavily loaded by the work such that the system is self-regulating in that the microwave power is applied to that part of the work which will absorb the most power.

CROSS-REFERENCE TO RELATED APPLICATION

This is a continuation-in-part of my application, Ser. No. 609,651, filed Jan. 16, 1967 and now abandoned.

DESCRIPTION OF THE PRIOR ART

Heretofore, klystrons have been employed to generate microwave power for industrial heating systems. However, in such systems it was necessary to employ the klystron as a typical amplifier and to drive the klystron with the output of a driver tube at power levels of 0.1 to 1.0 watt. Typically, the microwave power is at a frequency of 2450 mHz. Driver tubes at these frequencies and power levels have had rather poor operating life, i.e., on the order of 500 hours, whereas the klystron has an operating life on the order of 7500 hours.

Prior attempts to make the klystron into an oscillator by feeding back a portion of its output via an attenuator and adjustable phase shifter have not been successful due to phase shifts in the output of the klystron which vary with fluctuations of the beam voltage.

SUMMARY OF THE PRESENT INVENTION

The principal object of the present invention is the provision of an improved source of microwave power useful for, but not limited in use to, providing microwave power to industrial heating or treating systems.

One feature of the present invention is the provision of a microwave amplifier having a portion of its output fed back to its input via an electrically long feedback path having a length equal to or greater than Q wavelengths long where Q is the inverse of the fractional bandwidth of the tube and feedback path over which the loop gain is greater than unity, whereby the microwave amplifier is converted into a stable oscillator capable of operating at high microwave power levels.

One feature of the present invention is the provision of a klystron amplifier having a portion of its output fed back to its input via an electrically long transmission line feedback path having a length equal to or greater than Q wavelengths long where Q is the inverse of the fractional bandwidth of the tube and feedback path over which the loop gain is greater than unity, whereby the klystron amplifier is converted into a stable oscillator capable of operating at high microwave power levels.

Another feature of the present invention is the same as the preceding feature wherein the feedback path includes an electrically variable attenuator, preferably a PIN diode modulator, for electronically varying the attenuation in the feedback path for regulating the power output of the klystron oscillator.

Another feature of the present invention is the same as the preceding feature including the provision of means for sampling either the power output of the klystron oscillator or the power reflected from its load for deriving a signal which is compared with a reference signal to produce an error signal used to control the electrically variable attenuator in the feedback path of the klystron for regulating the R.F. power level of the klystron oscillator to supply controlled power to the applicator and/or to prevent excessive reflected power in the klystron output.

Another feature of the present invention is the same as any one or more of the preceding features wherein the feedback path around the glystron is taken from the output end of the microwave applicator, whereby, for narrow band applicators, the klystron oscillator is automatically tuned to the applicator frequency and whereby, forcertain cases of coupling, the power level of the klystron is automatically regulated to supply constant power to the load of the applicator.

Another feature of the present invention is the same as the immediately preceding feature wherein the applicator includes plural parallel connected sections tuned to different frequencies and wherein the feedback energy is coupled into the feedback path via the field perturbing effect of the work load upon the fields of the particular applicator section, whereby the klystron is tuned to the most heavily work loaded applicator section and whereby the more heavy the loading of that applicator the more microwave power supplied thereto.

Another feature of the present invention is the same as any one or more of the first three features including the provision of plural applicator sections tuned to different frequencies and the provision of a variable phase shifter in the feedback path for tuning the operating frequency of the klystron oscillator, whereby the power is shifted from one applicator to another according to the tuning of the phase shifter.

Another feature of the present invention is the provision of a microwave amplifier in the manner of any of the preceding features including the provision of a pulse generator coupled to the feedback path to modulate the microwave amplifier whereby pulses of microwave power are issued therefrom.

Other features and advantages of the present invention will become apparent upon a perusal of the following specification taken in connection with the accompanying drawings.

DESCRIPTION OF THE PREFERRED EMBODIMENTS

Figure 1:
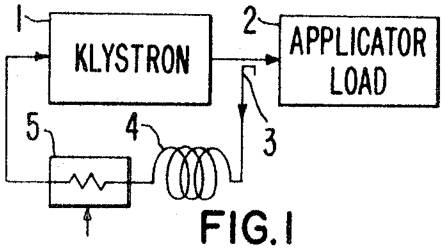
FIGURE 1 is a schematic block diagram of a klystron oscillator of the present invention employed as a source of microwave power for industrial heating.

Referring now to FIGURE 1, there is shown in block diagram form, an embodiment of the present invention. In this embodiment, a klystron power amplifier 1 such as, for example, a 30 kw. C.W. average power output, five cavity klystron, tuned to 2450 mHz. and having 50 db power gain, has its output coupled into a microwave applicator load 2 for applying microwave power to a material to be heated or treated. Other microwave amplifiers, for example power grid tubes and beam tubes, such as traveling wave tube devices, can be employed in place of the klystron power amplifier. A fraction of the output such as, for example, 20 watts is coupled from the klystron 1 via coupler 3 and fed back to the R.F. input of the klystron 1 via a long length of transmission line 4 and an electrically variable attenuator 5. The feedback can be taken from the output cavity of the klystron or any one of the klystron's intermediate cavities. A suitable transmission line 4 is RG/58U coaxial cable and a suitable attenuator 5 is a model 8732A PIN diode modulator marketed by Hewlett Packard Inc. of Palo Alto, Calif.

The transmission line 4 should have an electrical length at least equal to and preferably longer than Q wavelengths, where Q is the inverse of the fractional bandwidth of the closed loop circuit over which the closed loop gain is greater than unity. The closed loop circuit includes the klystron 1, and its feedback path comprising the coupler 3, transmission line 4 and attenuator 5. Although, in a preferred example of the present invention, the long length of transmission line 4 is provided by a physically long section of coaxial cable, a suitable slow wave circuit may be employed. Such a slow wave or filter circuit could have a sufficient number of coupled periodic sections to provide an electrical length equal to Q wavelengths, as previously described.

In a typical example, the klystron amplifier was a 5K70SH marketed by EIMAC, Division of Varian Associates of California and the RG/58U coaxial cable 4 was 100 feet long and had 15 db loss. The tube 1 was fixed tuned to 2450 mHz.

In the case of the circuit of FIGURE 1, where the closed loop does not include the microwave applicator or utilization device 2, klystron 1 preferably has a pass band which is included within the pass band of the applicator 2 in order to prevent excessive wave reflections from the load 2.

The closed loop microwave oscillator circuit of FIGURE 1 has several advantages over the prior art. The system is relatively simple and reliable and eliminates the prior art driver stage and associated power supply. In addition, when operated at full power the circuit is self-regulating as to power supply ripple. For example, when a klystron device is employed, the 15% peak-to-peak power supply ripple in the beam voltage as obtained from a 3 phase full wave bridge rectifier, not shown, is eliminated due to the saturation effects of the klystron oscillator. The average power output level is easily adjusted from 30 kw. to 2 kw. by adjusting the variable attenuator 5.

Figure 2:
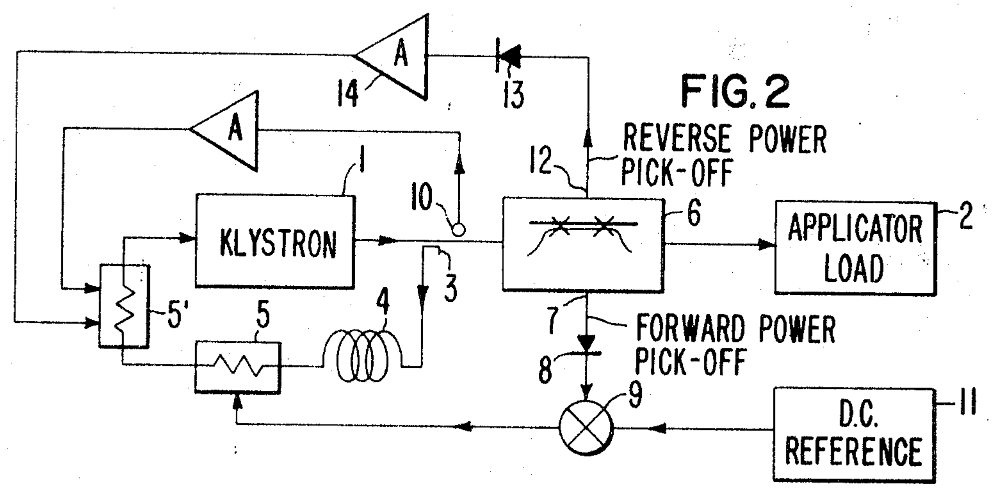

Referring now to FIGURE 2, there is shown an alternative embodiment of the present invention. In this embodiment, the circuit is substantially the same as that of FIGURE 1 except that a directional coupler 6 has been inserted in the circuit between the output of the klystron 1 and the input of its applicator load 2. The directional coupler 6 inches a forward power pick-off terminal 7 which samples the output power of the klystron being transmitted to the load 2. This sample is rectified by diode 8 to produce a D.C. signal representative of the forward power output which is fed to an error detector 9. The error detector 9 compares the forward power signal with a D.C. reference signal obtained from a D.C. reference source 11 to produce an error signal representative of the difference between the forward power level and a predetermined reference power level as determined by the reference signal. The error signal is fed to the variable attenuator 5 to control the power level of the klystron oscillator 1. This regulation will not only stabilize the oscillator amplitude without expensive primary power line regulation but will remove power supply ripple from the output thus eliminating high voltage filter components and their protective circuitry.

In addition, the directional coupler 6 includes a reverse power pick-off terminal 12 which samples the power reflected from the load 2. The sampled reflected power is rectified by diode 13 and amplified by D.C. amplifier 14 and fed back to the control terminal of a second variable attenuator 5'. When the reflected power tends to increase, the reverse flow signal feedback to the attenuator 5' reduces the power level of the klystron oscillator to prevent excessive voltage across the output window of the klystron 1. Excessive voltage could burn out the output window of the klystron. By merely reducing the power level of the klystron, normal operation is quickly restored when the cause of the excess power reflection is removed.

Moreover, an arc protector circuit is incorporated for sensing an arc in the output waveguide of the klystron 1 and reducing the power level of the oscillator to quench the arc. More specifically, a photocell 10 is disposed in the output waveguide to sense when an arc is struck therein. The output of the photocell 10 is fed via an amplifier to one of the PIN attenuator 5' to reduce the power level of the klystron oscillator until the arc is extinguished. Alternatively, with reference to FIGURE 6, the output of the photocell 10 could be fed via an amplifier 41 to the gate electrode 42 of a silicon controlled rectifier (SCR) 43 connected in series between a power supply 44 and the variable PIN attenuator 5'. The amplified output of the photocell 10 gates the SCR 43 to the "on" state thereby connecting the power supply 44 to the attenuator 5'. The power supply 44 delivers a voltage signal to the attenuator 5' to increase the attenuation in order to reduce the loop gain below unity under any operating conditions, thereby stopping the microwave amplifier from oscillating. When the arc is extinguished, the SCR 43 is returned to its "off" state by opening switch 46 to interrupt the conduction path between the power supply 44 and attenuator 5'. This disconnects the power supply 44 from the attenuator 5' thereby allowing the microwave amplifier 1 to resume normal operation.

Figure 3:
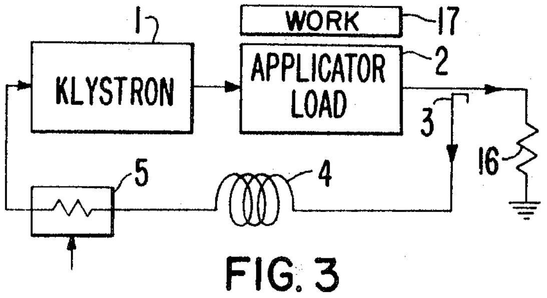
FIGURES 2–6 are schematic block diagrams of alternative embodiments of the present invention.

Referring now to FIGURE 3, there is shown an alternative embodiment of the present invention. In this embodiment, the feedback signal for the klystron oscillator is derived from the unabsorbed power output of the applicator load 2. The uncoupled portion of the unabsorbed power is fed to a suitable load 16.

The circuit of FIGURE 3 has certain advantages. For example, it is self-regulating as far as coupling a constant power into the work load 17. This is seen when it is considered that if the work 17 tends to absorb less microwave power the feedback power will increase due to the reduced absorption, thereby increasing the power level of the klystron oscillator to force more power into the work 17. Conversely, if the work tends to absorb more power, the feedback is reduced to lower the power supplied to the work 17.

Another advantage accrues from the circuit of FIGURE 3 when the applicator has a narrower pass band than the pass band of the klystron amplifier 1. In this case, the applicator 2 is included in the closed loop and its fractional bandwidth determines the length of the transmission line 4 and the oscillating frequency of the klystron oscillator, thereby assuring that the klystron drives the load within the pass band of the load 2 to prevent excessive wave reflections from the load 2.

Figure 4:
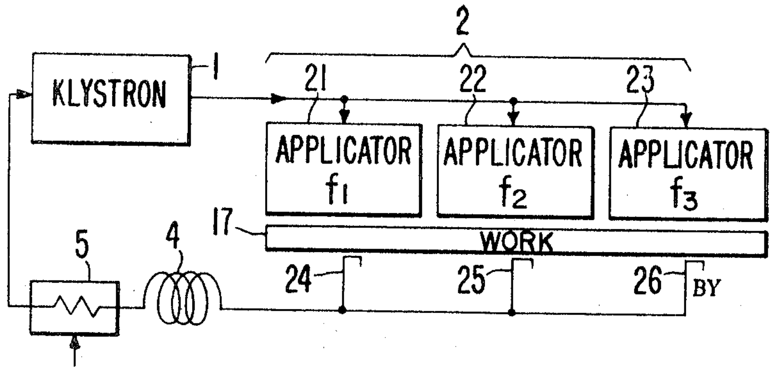

Referring now to FIGURE 4, there is shown an alternative embodiment of the present invention. In this embodiment, the microwave applicator load 2 is divided into plural sections 21, 22 and 23, respectively, each tuned to a different frequency $f_1$, $f_2$, $f_3$, respectively, within the pass band of the klystron 1. The workpiece 17 is disposed adjacent the applicator sections. Couplers 24, 25 and 26, respectively, are disposed adjacent the applicators and the workpiece 17 in such a manner that the R.F. coupling from each applicator section 21, 22 or 23 to its respective coupler 24, 25 or 26 is directly related to the amount of energy absorbed by that particular portion of the work 17 disposed adjacent the particular applicator section.

Thus, in operation, the klystron 1 will oscillate at the frequency $f_1$, $f_2$, or $f_3$ of the particular applicator section 21, 22 or 23 which is delivering the greatest energy to the workpiece 17. This is especially desirable for curing or drying workpieces such as plywood or other sheet material which have spots or streaks which require more energy to dry or treat. More particularly, if a wet spot is under applicator section 22, the system will oscillate at $f_2$ to deliver the energy to that portion of the workpiece 17. When the wet spot is dried sufficiently such that it absorbs less energy than a region under another one of the applicator sections, say, for example, applicator section 21, the coupling through that other section 21 will dominate and automatically shift the oscillating frequency to $f_1$. Thus, the frequency of the system is automatically shifted in order to obtain uniform drying of the workpiece 17.

Figure 5:
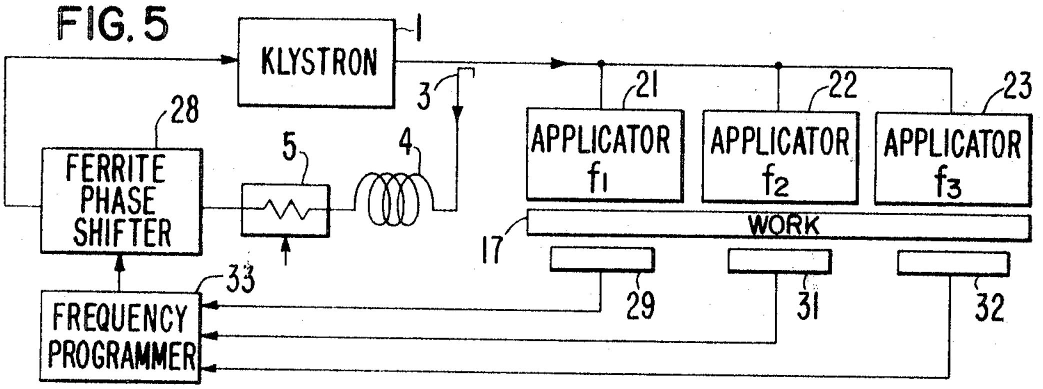

Referring now to FIGURE 5, there is shown an alternative embodiment of the present invention. In this embodiment, the apparatus is similar to that FIGURE 4 except that the feedback is taken via coupler 3 from the output of the klystron 1 and the feedback path includes a ferrite phase shifter 28 which introduces a variable phase shift for tuning the oscillating frequency of the system to any one of the frequencies of the applicator sections 21, 22 or 23. In addition, plural moisture detectors 29, 31 or 32 or other sensing devices sense the amount of microwave treatment required by those portions of the workpiece 17 disposed adjacent each of the microwave applicator sections 21, 22 or 23.

The sensing devices feed their respective output signals to a frequency programmer 33 which in turn feeds a signal to the ferrite phase shifter to tune the oscillating frequency of the klystron 1 to the frequency of the applicator section 21, 22 or 23 requiring the most microwave power for treatment of the various sections of the workpiece 17 as determined by the sensors 29, 31 or 32. Alternatively, the frequency programmer 33 can switch the microwave power to the various applicator sections 21, 22 or 23 according to a predetermined sequence or in response to commands of an operator.

In the embodiments of FIGURES 4 and 5, klystron 1 is frequency-modulated in accordance with particular occurrences in the applicator load 2. However, the klystron 1 could be frequency-modulated independent of the applicator load 2 to provide, for example, electronic mode stirring in an applicator whereby the time-averaged microwave energy distribution therein is made more uniform. This could be accomplished in a circuit like that of FIGURE 5 wherein the ferrite phase shifter 28 would be operated to continuously shift the frequency of the klystron 1 independent of the applicator load 2.

Referring again to FIGURE 6, an alternate embodiment of the present invention is illustrated wherein means 45 are provided to modulate the output of the microwave oscillator. In the illustrated embodiment, a pulse generator 47 is coupled through a switch 48 for providing a train of voltage pulses 49 to the variable PIN attenuator 5' to periodically reduce the feedback power to cut off the microwave amplifier 1. This results in pulse-modulating the microwave amplifier whereby the oscillator circuit provides pulses of microwave power. The repetition rate and duration of the pulses of microwave power provided is determined by the repetition rate and the pulse width of the pulses 49 provided by the pulse generator 47. The microwave oscillator can be modulated in other ways if desired, for example, by coupling a signal to the PIN attenuator 5' to vary its attenuation to effect less than 100% modulation of the output provided by the microwave amplifier 1, or by varying the phase of the feedback signal to accomplish frequency modulation as described above.

Figure 6:
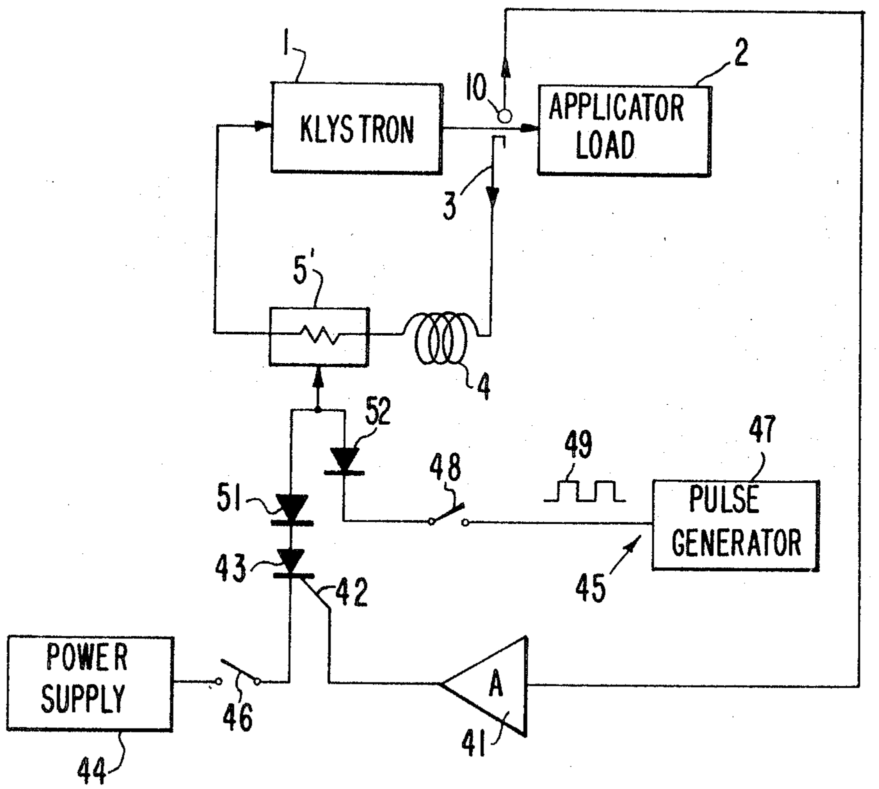

In the illustrated embodiment of FIGURE 6, both the modulation circuit and arc protection circuit are coupled to the single electrically variable attenuator 5'. To electrically isolate the circuits, blocking diodes 51 and 52 are provided.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a source of microwave power, means forming a microwave amplifier, means forming a feedback circuit path for feeding microwave power amplified by said microwave amplifier back to an input of said microwave amplifier means to sustain oscillation of said microwave amplifier, the improvement wherein, said feedback circuit path means includes a transmission line through which the feedback signal passes which has an electrical length at least equal to Q wavelengths long, where Q is the inverse of the fractional bandwidth of the closed circuit loop around said feedback path and through the microwave amplifier means over which the loop gain is greater than unity, whereby the microwave amplifier means with its feedback path forms a stable source of microwave power.

2. The apparatus of claim 1 wherein said microwave amplifier means is a klystron.

3. The apparatus of claim 1 including, a variable attenuator means in said feedback circuit path for controlling the power output level of the microwave amplifier.

4. The apparatus of claim 3 wherein said variable attenuator is a PIN diode modulator.

5. The apparatus of claim 3 including, means for deriving an output from the output microwave power of said microwave amplifier, means for comparing the derived signal with a reference signal to produce an error signal determinative of the difference between the output power of said microwave amplifier and a predetermined reference power level, and means for feeding the error signal to said variable attenuator for controlling the amplitude of the microwave feedback signal to control the power level of said microwave amplifier means.

6. The apparatus of claim 3 including a directional coupler means coupled into the output of said microwave amplifier for deriving a signal representative of the microwave power output of said microwave amplifier reflected back toward said microwave amplifier from its load, means for feeding the derived reflected power signal back to said variable attenuator for reducing the output power of said microwave amplifier when the reflected power exceeds a certain level, thereby preventing excessive voltages in the output of said microwave amplifier means.

7. The apparatus of claim 3 including a directional coupler means coupled into the output of said microwave amplifier for deriving a first signal representative of the microwave power output of said microwave amplifier reflected back toward said microwave amplifier from its load and a second signal representative of the microwave power output of said microwave amplifier, means for feeding the derived reflected power signal back to said variable attenuator means for reducing the output power of said microwave amplifier in accordance with reflected power, means for comparing the microwave power output signal with a reference signal to produce an error signal determinative of the difference between the output power of said microwave amplifier and a predetermined reference power level, and means for feeding the error signal to said variable attenuator means for controlling the amplitude of the microwave feedback signal to control the power level of said microwave amplifier means.

8. The apparatus of claim 7 wherein said microwave amplifier is a klystron.

9. The apparatus of claim 1 including a microwave power utilization device coupled to the output of said microwave amplifier means having a pass band narrower than the band of said microwave amplifier means, and wherein said feedback circuit path means is coupled to an output of said utilization device such that the closed circuit loop includes said microwave amplifier, said utilization device and said feedback path, whereby the microwave oscillator oscillates at a frequency within the pass band of said utilization device.

10. The apparatus according to claim 9 wherein said microwave amplifier is a klystron.

11. The apparatus of claim 1 including a microwave power utilization device coupled to the output of said microwave amplifier means, and wherein said feedback circuit path means is coupled to an output of said utilization device such that power absorbed by a work load in said utilization device reduces the signal coupled from the output of said utilization device into said feedback path, and such that the closed circuit loop includes said microwave amplifier, said utilization device and said feedback path, whereby the power level of the microwave oscillator is automatically regulated by the feedback signal to regulate the microwave power absorbed by the work load.

12. The apparatus of claim 1 including, a microwave power utilization device coupled to the output of said microwave amplifier means, said utilization device having a plurality of sections having different pass band frequencies narrower than the pass band of said microwave amplifier means, and each adapted to apply microwave power to different work load portions, and wherein said feedback circuit path means includes a coupling means coupled to each of the different sections of said utilization device, each of said coupling means being arranged such that the coupling through its respective section of said utilization device into said feedback path increases with increased power absorbed by its respective work load portion, and wherein the closed circuit loop includes said microwave amplifier, said utilization device and said feedback path, whereby the microwave oscillator is tuned to the pass band containing the work load portion absorbing the greatest amount of microwave power thereby distributing the microwave power to such load portion.

13. The apparatus according to claim 12 wherein said microwave amplifier is a klystron.

14. The apparatus of claim 1 including a microwave power utilization device coupled to the output of said microwave amplifier means, said utilization device having a plurality of sections having different pass band frequencies within the tunable pass band of said microwave amplifier means, each section of said utilization device adapted to apply microwave power to different work load portions, and wherein said feedback circuit path means includes a variable phase shifter for tuning the microwave oscillator over its tunable pass band, whereby the various sections of said utilization device may be sequentially energized in accordance with the tuning of said microwave oscillator means via said phase shifter means.

15. The apparatus according to claim 14 wherein said microwave amplifier is a klystron.

16. The apparatus of claim 15 wherein said phase shifter is a ferrite phase shifter.

17. The apparatus of claim 1 wherein said transmission line forming the feedback path includes a length of coaxial cable greater than 50 wavelengths long.

18. The apparatus of claim 1 wherein said transmission line forming the feedback path includes a length of slow wave circuit having an electrical length greater than 50 wavelengths long.

19. The apparatus of claim 1 including means for varying the feedback signal coupled back to the input of said microwave amplifier means whereby the output from said microwave power source is modulated.

20. The apparatus of claim 19 including an electrically variable attenuator means in said feedback circuit for controlling the power level of the microwave amplifier, and wherein said feedback power varying means is a pulse generator coupled to said attenuator to periodically increase the attenuation of the feedback power to periodically cut off the microwave amplifier whereby said microwave power source issues pulses of microwave power.

21. The apparatus of claim 20 wherein said microwave amplifier is a klystron.

22. The apparatus of claim 1 including a microwave power utilization device coupled to the output of said microwave amplifier means, means for sensing the occurrence of arcs in said utilization device, and means responsive to said sensing means to reduce the power output of said microwave amplifier means when arcs occur.

23. The apparatus of claim 22 wherein said responsive means is coupled to said feedback path to reduce the feedback power to cut off the microwave amplifier.

References Cited

UNITED STATES PATENTS

| | | | |
|---|---|---|---|
| 2,409,992 | 10/1946 | Strobel | 331—80 |
| 3,104,359 | 9/1963 | Tachizawa et al. | 331—82 |
| 3,344,363 | 9/1967 | Consoli et al. | 331—83 |

JOHN KOMINSKI, Primary Examiner

SIEGFRIED H. GRIMM, Assistant Examiner

U.S. Cl. X.R.

219—10; 331—62, 83, 173, 177, 183